United States Patent
Weon et al.

(10) Patent No.: US 6,599,803 B2
(45) Date of Patent: Jul. 29, 2003

(54) METHOD FOR FABRICATING SEMICONDUCTOR DEVICE

(75) Inventors: Dae-Hee Weon, Ichon-shi (KR); Seung-Ho Hahn, Ichon-shi (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 10/222,550

(22) Filed: Aug. 16, 2002

(65) Prior Publication Data

US 2003/0104645 A1 Jun. 5, 2003

(30) Foreign Application Priority Data

Dec. 3, 2001 (KR) .......................................... 2001-75863

(51) Int. Cl.[7] .................... H01L 21/336; H01L 21/00; H01L 21/84; H01L 29/06; H01L 31/117
(52) U.S. Cl. .................... 438/300; 438/149; 438/231; 438/257; 438/268; 438/752; 257/19; 257/616
(58) Field of Search ................... 438/300, 149, 438/231, 268, 257, 752; 257/19, 616

(56) References Cited

U.S. PATENT DOCUMENTS

| 5,073,516 A | | 12/1991 | Moslehi ..................... 437/89 |
| 5,168,072 A | * | 12/1992 | Moslehi ..................... 438/300 |
| 5,291,053 A | * | 3/1994 | Pfiester et al. ............... 257/393 |
| 5,321,306 A | | 6/1994 | Choi et al. .................. 257/754 |
| 5,336,903 A | * | 8/1994 | Ozturk et al. ................ 257/19 |
| 5,710,450 A | * | 1/1998 | Chau et al. .................. 257/344 |
| 5,804,470 A | | 9/1998 | Wollesen ..................... 438/141 |
| 5,818,100 A | * | 10/1998 | Grider et al. ................ 257/616 |
| 5,895,948 A | | 4/1999 | Mori et al. .................. 257/306 |
| 5,949,105 A | * | 9/1999 | Moslehi ..................... 257/336 |
| 6,030,894 A | | 2/2000 | Hada et al. .................. 438/675 |
| 6,063,677 A | * | 5/2000 | Rodder et al. .............. 438/300 |
| 6,090,691 A | | 7/2000 | Ang et al. ................... 438/564 |
| 6,197,641 B1 | * | 3/2001 | Hergenrother et al. ...... 438/268 |
| 6,235,568 B1 | * | 5/2001 | Murthy et al. ............... 438/231 |
| 6,306,691 B1 | * | 10/2001 | Koh .......................... 438/149 |
| 6,403,433 B1 | * | 6/2002 | Yu et al. ..................... 438/300 |
| 6,479,358 B1 | * | 11/2002 | Yu ............................ 438/300 |
| 6,489,206 B2 | * | 12/2002 | Chen et al. .................. 438/300 |

FOREIGN PATENT DOCUMENTS

| JP | 01-107219 | 4/1989 |
| JP | 07-130682 | 5/1995 |

* cited by examiner

Primary Examiner—Matthew Smith
Assistant Examiner—Chuong A Luu
(74) Attorney, Agent, or Firm—Marshall, Gerstein & Borun

(57) ABSTRACT

A method for fabricating a semiconductor device suitable for embodying an isotropic etching profile in etching a silicon substrate when a single drain cell is formed, including the steps of: a) forming a gate electrode on a silicon substrate; b) forming a spacer contacting both sides of the gate electrode; c) growing a silicon germanium layer on the silicon substrate exposed at the bottom of the spacer; d) exposing a source/drain formation region by selectively removing the silicon germanium layer; and e) growing an epitaxial silicon layer doped on the opened source/drain region.

6 Claims, 3 Drawing Sheets

METHOD FOR FABRICATING SEMICONDUCTOR DEVICE

BACKGROUND OF THE DISCLOSURE

1. Field of the Disclosure

The disclosure relates generally to a method for fabricating a semiconductor device and, more particularly, to a method for fabricating a highly integrated semiconductor device with a design rule of under 0.1 µm.

2. Description of Related Art

Generally, a metal oxide semiconductor field effect transistor (MOSFET) of a semiconductor device includes a source/drain region and a gate region isolated by a dielectric layer on a channel region limited to the area between the source/drain regions. The source/drain region is doped to form a deep junction, and if a voltage is supplied to the gate and it surpasses a predetermined threshold value, the channel between the source and the drain becomes conductive and the transistor is turned on, thus flowing electron carriers from the source to the drain.

However, the transistor may be damaged by the hot carrier injection of high-speed electrons that impact the silicon/substrate interface formed between the source and the gate, for example, a silicon oxidation layer or a silicon interface, which is called the hot carrier effect.

The hot carrier effect occurs when the kinetic energies of exited carriers such as holes and electrons are increased as the carriers are accelerated and trapped into the gate dielectric layer through the sharp variation of their potentials. The sharp variation of the potential occurs, apparently, around the drain during the saturated operation of transistors. A huge electric field, generated by the sharp variation of the potential, is exhibited in the side junction part of a drain that neighbors channels. Hot carriers lose their energies by impact ionization when they move through the drains. As a result, an electron hole pair (EHP) is generated and moves to a gate dielectric layer around the drain junction part, and is injected to a gate dielectric layer.

To overcome the problem of hot carrier effect and other related problems, the "lightly doped drain" (LDD) structure has been suggested. The LDD structure decreases the extent of variation of the potential around the drain during saturated operation of a transistor.

However, in a method of fabricating a transistor with the LDD structure, the silicon substrate is inevitably damaged in the process of ion-injecting a low-concentration impurity for forming an LDD region and the process of ion-injecting a high-concentration impurity for forming a highly concentrated source/drain region. Also, a short channel effect, that is, shortening of the actual channel length, occurs by an annealing process performed after the source/drain ion injection in order to diffuse the ions injected in the prior process.

As a result, due to the short channel effect, the depletion layer around the drain reaches the source region, and a current uncontrolled by voltage leaks a great deal, thus causing a punch-through phenomenon in which the function of the electric field transistor is lost. Also, the properties of the device deteriorate because the threshold voltage of the device is changed.

To solve the problem of the LDD structure described above, a technique of a single drain cell (SDC) has been proposed. With a reduced surface resistance, formation of sharp junction, low contact resistance, reduced thermal budget, and easy formation of silicide, the SDC technique shows wide applicability.

FIGS. 1A and 1B are cross-sectional views illustrating a method for fabricating a conventional single drain cell.

As shown in FIG. 1A, after a gate insulation layer 12 and a gate electrode 13 are formed in order on a silicon substrate 11, a spacer 14 contacting both sidewalls of the gate electrode 13 is formed.

Subsequently, the silicon substrate 11 exposed after forming the spacer 14, i.e., regions for source and drain, are dry-etched or wet-etched to a predetermined depth, using the spacer 14 and the gate electrode 13 as an etching mask.

As shown in FIG. 1B, a source/drain 15 is formed on the etched silicon substrate 11 by depositing a doped silicon layer with a chemical vapor deposition (CVD) method.

In this SDC technique, the core technology is to etch the silicon substrate vertically and horizontally with the same ratio because it is important to etch the silicon substrate to have an isotropic property.

However, in this conventional technology, since the exposed silicon substrate is directly dry- or wet-etched directly, it is difficult to form a proper etching pattern of the silicon substrate, i.e., depth and shape, for forming the source/drain region.

SUMMARY OF THE DISCLOSURE

The disclosure provides a method for fabricating a semiconductor device appropriate for embodying an isotropic etching profile when etching a silicon substrate and forming a single drain cell.

In accordance with the disclosure, a method of fabricating a semiconductor device is provided, comprising the steps of: a) forming a gate electrode on a silicon substrate; b) forming a spacer contacting both sides of the gate electrode; c) growing a silicon germanium layer on the silicon substrate exposed at the bottom of the spacer; d) exposing a source/drain formation region by removing the silicon germanium layer; and e) growing the epitaxial silicon layer doped on the opened source/drain region.

BRIEF DESCRIPTION OF THE DRAWINGS

These and other objects and features of the disclosure will become apparent from the following description of examples given in conjunction with the accompanying drawings, in which.

DETAILED DESCRIPTION

Figure 1A:
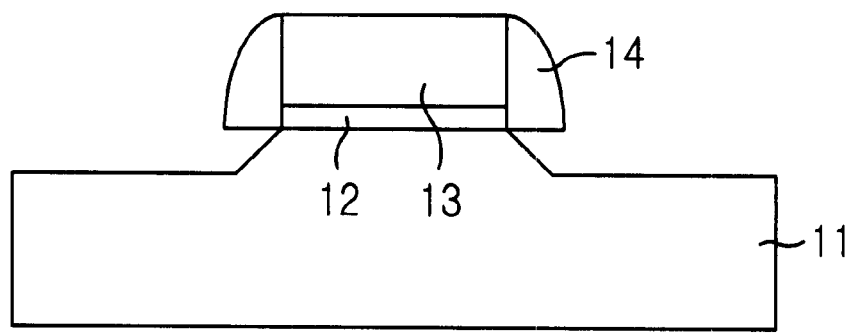
FIGS. 1A and 1B are cross-sectional views illustrating a method for fabricating a conventional single drain cell.
Figure 1B:
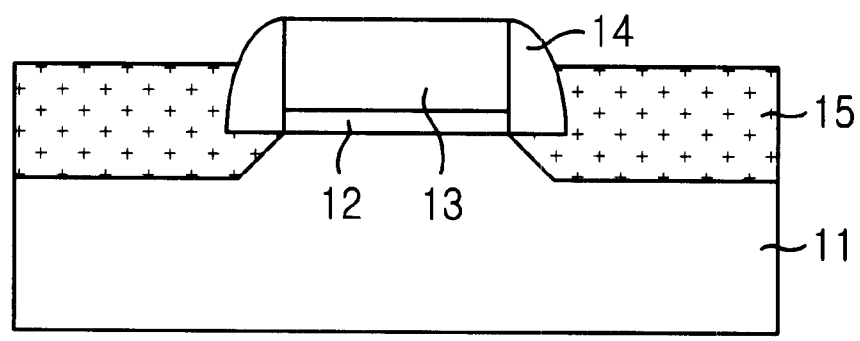
Figure 2A:
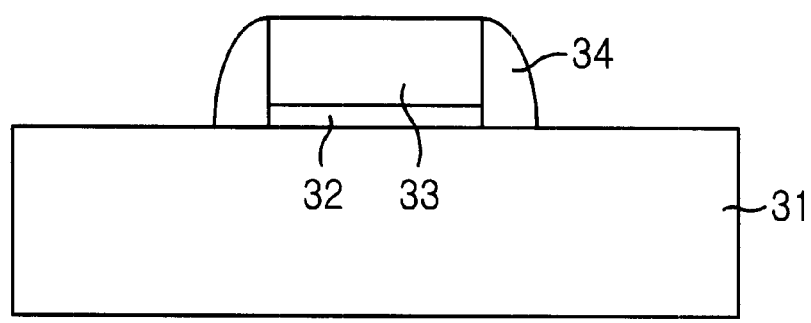
FIGS. 2A to 2D are cross-sectional views illustrating a method for fabricating a single drain cell (SDC) in accordance with the disclosure.

Referring to FIG. 2A, after a gate insulation layer 32 and a gate electrode 33 are successively formed on a silicon substrate 31, a nitride layer is deposited on the entire surface including the gate electrode 33. Then, a spacer 34 contacting both sides of the gate electrode 33 is formed on sidewalls of the gate electrode 33 and the gate insulation layer 32 by etching the nitride layer.

Here, the gate electrode 33 can be formed of any of polysilicon, metal, polycide, etc., and the spacer 34 should be necessarily formed of a nitride layer whose thickness ranges from 100 Å to 800 Å.

The spacer 34 is formed with the nitride layer in order to prevent the spacer from being damaged in the subsequent process of etching a silicon germanium layer.

Figure 2B:
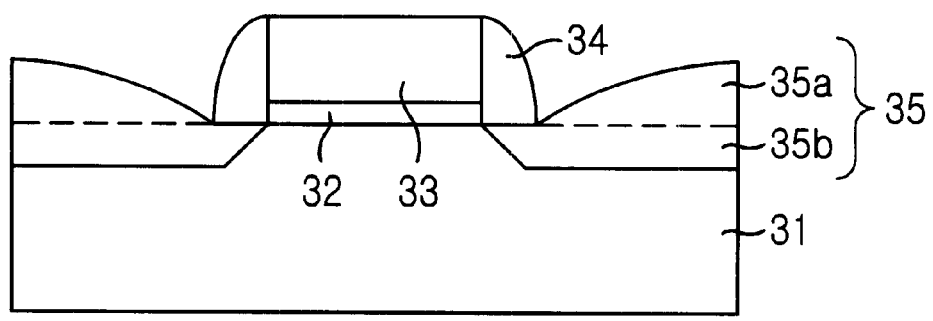

As shown in FIG. 2B, a cleaning process is performed with an HF solution or buffered oxide etchant (BOE) in order to remove a native oxide layer on the silicon substrate 31 exposed after forming the spacer 34, and then a silicon germanium layer 35 is grown with a selective epitaxial growth (SEG) method on the exposed silicon substrate 31 at a thickness of about 500 Å to about 5000 Å.

Here, the SEG process is carried out with a low pressure chemical vapor deposition (LPCVD) or ultra high vacuum CVD method.

In the LPCVD method of the silicon germanium layer 35, a baking process is performed in-situ in an $H_2$ atmosphere at a temperature of about 700° C. to about 1000° C. for about 1 minute to about 30 minutes, before the silicon germanium layer 35 is grown. The silicon germanium layer 35 is grown by flowing source gases of $SiH_2Cl_2$, HCl, and $GeH_4$, each of about 10 sccm to about 500 sccm, into a chamber maintained at about 5 Torr to about 300 Torr. Here, the temperature for growing the silicon germanium layer 35 is preferably about 600° C. to about 800° C.

The silicon germanium layer 35 is formed on a silicon substrate 31 surface and the lower part of the surface. In addition to the silicon germanium layer 35A grown on the silicon substrate 31, a silicon germanium layer 35B is formed extending into the lower part of the spacer 34 and the silicon substrate 31 to a predetermined depth, because germanium (Ge) is diffused into the substrate 31 vertically and horizontally in the process of forming the silicon germanium layer 35A.

Meanwhile, in order to reduce the contact resistance between the silicon substrate 31 and the silicon germanium layer 35, a doped silicon germanium layer can be grown by adding about 100 sccm to about 500 sccm of $PH_3$ or $AsH_3$ while growing the silicon germanium layer 35.

Figure 2C:
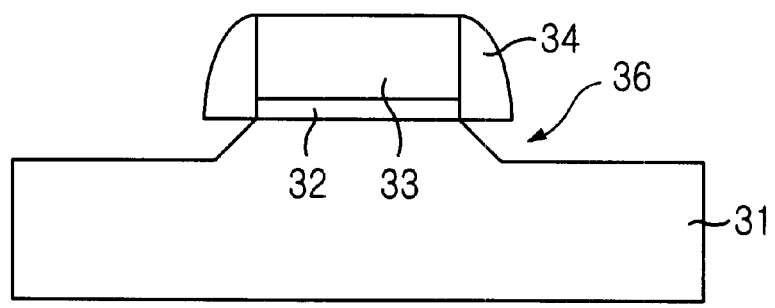
Figure 2D:
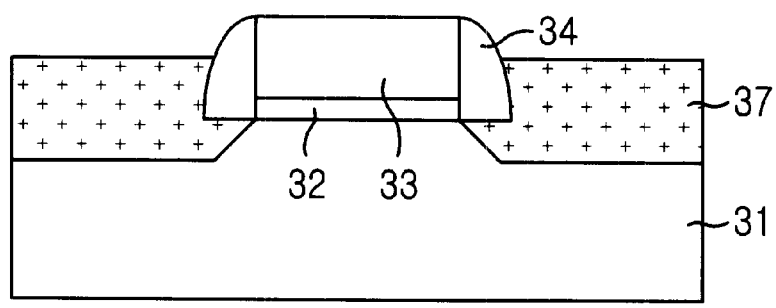

As shown in FIG. 2C, the silicon germanium layer 35 is etched by using an etching selection ratio of the silicon substrate 31 and the silicon germanium layer 35. Here, the silicon germanium layer 35B formed in the lower part of the spacer 34 and the silicon substrate 31 is etched together, thus obtaining a space 36 to be formed with a single drain. The silicon substrate 31 exposed after being etched has an isotropic etching profile.

Here, the solution for etching the silicon germanium layer 35 should etch the silicon germanium layer only, not etching the silicon substrate and polysilicon, and usually a wet etching solution mixed with a nitric acid, hydrofluoric acid, and distilled water.

When using this wet etching solution, the silicon germanium is etched prior to the silicon substrate or polysilicon, thus a desired etch profile can be obtained.

The process of etching a silicon germanium layer can control the amount of germanium diffused into the silicon substrate 31 and control the depth and shape of the silicon substrate 31 to etch by altering the thickness and process condition while growing the silicon germanium layer 35.

After the observation of the silicon substrate etching profile, the etching depth and shape of the substrate change as the growth thickness of the silicon germanium layer is thicker.

As shown in FIG. 3D, a single drain is formed by growing the epitaxial silicon layer 37 doped on the silicon substrate 31 that is exposed after the silicon germanium layer 35 is etched. Here, the doped epitaxial silicon layer 37 is grown to a thickness of about 100 Å to about 500 Å, using a low pressure chemical vapor deposition (LPCVD) or an ultra high vacuum CVD method.

First, to grow the epitaxial silicon layer 37 doped in the LPCVD method, a baking process should be carried out in-situ in an $H_2$ atmosphere at a temperature of about 800° C. to about 1000° C. for about 1 minute to about 5 minutes, before the silicon germanium layer 35 is grown. The silicon germanium layer 35 is grown by flowing in source gases of $SiH_2Cl_2$ and HCl, each about 10 sccm to about 500 sccm, in a chamber with its internal pressure kept at about 5 Torr to about 300 Torr. In case of N+ conductive drain, $PH_3$ or $AsH_3$ gas is used as the doping gas, and in case of P+ conductive drain, $B_2H_6$ gas is used as the doping gas and the doped epitaxial silicon layer is grown.

To grow the doped epitaxial silicon layer 37 in the ultra high vacuum chemical vapor deposition (UHV CVD) method, the layer should be grown at a temperature of about 400° C. to about 800° C. at the pressure of about 1 m Torr to about 1000 Torr. The baking procedure is carried out in an $H_2$ atmosphere, and the source gases and doping gases are the same as the LPCVD method.

The depth and the shape of the silicon substrate can be controlled by altering process conditions and the thickness of the silicon germanium growing on the silicon substrate, thus controlling the amount of germanium diffused into the silicon substrate. Accordingly, the isotropic etching profile of a silicon substrate where the source/drain region is to be formed, can be embodied and the inherent properties of a single drain cell structure can be preserved.

As described above, the method can easily embody an isotropic etching profile of a silicon substrate for an SDC technology, and thus brings about reduced surface resistance, formation of sharp junction, low contact resistance, reduced thermal budget and ease formation of silicide.

Various changes and modifications may be made without departing from the scope of the disclosure.

What is claimed is:

1. A method of fabricating a semiconductor device, comprising the steps of:
    a) forming a gate electrode having two sides on a silicon substrate;
    b) forming a spacer contacting both sides of the gate electrode, said spacer defining a bottom and exposing the silicon substrate;
    c) growing a silicon germanium layer on the silicon substrate exposed at the bottom of the spacer;
    d) exposing a source/drain formation region by selectively removing the silicon germanium layer; and
    e) growing an epitaxial silicon layer doped on the exposed source/drain formation region.

2. The method of claim 1, wherein the silicon germanium layer is selectively removed with a mixed solution of nitric acid, hydrofluoric acid, and distilled water.

3. The method of claim 1, comprising growing the silicon germanium layer to a thickness of about 500 Å to about 5000 Å.

4. The method of claim 1, wherein step b) includes the steps of:
    b-1) cleaning the entire silicon substrate after the formation of the spacer; and
    b-2) baking the cleaned silicon substrate in an atmosphere of $H_2$ at a temperature of about 800° C. to about 1000° C.

5. The method of claim 1, comprising forming the silicon germanium layer in a low pressure chemical vapor deposition (LPCVD) method, flowing source gases of $SiH_2Cl_2$, HCl and $GeH_4$ at a rate of about 10 sccm to about 500 sccm each at a pressure of about 5 Torr to about 300 Torr.

6. The method of claim 5, comprising adding $PH_3$ gas or $AsH_3$ gas when the silicon germanium layer is deposited in the LPCVD method.

* * * * *